(12) United States Patent
Tamura et al.

(10) Patent No.: US 10,253,181 B2
(45) Date of Patent: *Apr. 9, 2019

(54) REFLECTOR FOR LED AND LIGHT-EMITTING DEVICE EQUIPPED WITH SAME

(75) Inventors: Kozo Tamura, Tsukuba (JP); Hideharu Matsuoka, Tokyo (JP); Ryu Kohase, Kurashiki (JP)

(73) Assignee: KURARAY CO., LTD., Kurashiki-shi (JP)

( * ) Notice: Subject to any disclaimer, the term of this patent is extended or adjusted under 35 U.S.C. 154(b) by 560 days.

This patent is subject to a terminal disclaimer.

(21) Appl. No.: 13/394,583

(22) PCT Filed: Sep. 2, 2010

(86) PCT No.: PCT/JP2010/005413
§ 371 (c)(1),
(2), (4) Date: Mar. 7, 2012

(87) PCT Pub. No.: WO2011/027562
PCT Pub. Date: Mar. 10, 2011

(65) Prior Publication Data
US 2012/0170277 A1  Jul. 5, 2012

(30) Foreign Application Priority Data

Sep. 7, 2009 (JP) .................................. 2009-205662
Mar. 30, 2010 (JP) .................................. 2010-078951

(51) Int. Cl.
*F21V 7/22* (2018.01)
*C08L 77/06* (2006.01)
(Continued)

(52) U.S. Cl.
CPC .............. *C08L 77/06* (2013.01); *C08G 69/26* (2013.01); *C08G 69/265* (2013.01); *G02B 1/041* (2013.01);
(Continued)

(58) Field of Classification Search
CPC ...... C08G 69/265; C08G 69/26; G02B 1/041; C08L 77/06; H01L 2224/49107;
(Continued)

(56) References Cited

U.S. PATENT DOCUMENTS 4,737,049 A * 4/1988 Callhan ................... E01F 9/571
116/63 R
4,780,507 A * 10/1988 Gaku ..................... C08G 59/12
428/417

(Continued)

FOREIGN PATENT DOCUMENTS

JP          7 228690         8/1995
JP       2000 204244         7/2000
(Continued)

OTHER PUBLICATIONS

Englsih language translation of JP 2006-257314, pp. 1-14.*
(Continued)

*Primary Examiner* — Alexander C Kollias
(74) *Attorney, Agent, or Firm* — Oblon, McClelland, Maier & Neustadt, L.L.P.

(57) ABSTRACT

The present invention provides a reflector for an LED, including a polyamide composition and configure to keep high reflectance and high degree of whiteness even after being irradiated with LED light for a long period of time. The present invention is a reflector for an LED, including a polyamide composition containing polyamide (A) that has dicarboxylic acid units including 50 to 100 mol % of 1,4-cyclohexanedicarboxylic acid units and diamine units (Continued)

including 50 to 100 mol % of aliphatic diamine units having 4 to 18 carbon atoms.

14 Claims, 2 Drawing Sheets

(51) Int. Cl.
- C08G 69/26 (2006.01)
- G02B 1/04 (2006.01)
- C08K 3/22 (2006.01)
- C08K 5/00 (2006.01)

(52) U.S. Cl.
CPC .............. C08K 3/22 (2013.01); C08K 5/005 (2013.01); H01L 2224/48091 (2013.01); H01L 2224/48247 (2013.01); H01L 2224/48257 (2013.01); H01L 2224/49107 (2013.01); H01L 2924/181 (2013.01)

(58) Field of Classification Search
CPC . H01L 2224/48257; H01L 2224/48247; H01L 2224/48091; H01L 2924/181; C08K 5/005; C08K 3/22
USPC ........................................................ 524/606
See application file for complete search history.

(56) References Cited

U.S. PATENT DOCUMENTS

| | | | |
|---|---|---|---|
| 5,670,608 A | 9/1997 | Oka et al. | |
| 6,156,869 A * | 12/2000 | Tamura et al. | 528/310 |
| 7,009,029 B2 | 3/2006 | Oka et al. | |
| 2003/0136498 A1* | 7/2003 | Calvar | B29C 47/062 |
| | | | 156/128.6 |
| 2004/0049006 A1* | 3/2004 | Aramaki | C08G 69/02 |
| | | | 528/335 |
| 2006/0141315 A1* | 6/2006 | Murata | C08L 71/02 |
| | | | 429/483 |
| 2008/0191224 A1* | 8/2008 | Emerson | H01L 33/42 |
| | | | 257/98 |
| 2009/0110888 A1* | 4/2009 | Wuest | B32B 27/28 |
| | | | 428/200 |
| 2010/0173139 A1 | 7/2010 | Miyoshi et al. | |
| 2011/0028614 A1* | 2/2011 | Shikano | C08G 69/265 |
| | | | 524/126 |
| 2012/0228564 A1 | 9/2012 | Hashimoto et al. | |

FOREIGN PATENT DOCUMENTS

| | | | |
|---|---|---|---|
| JP | 2002 294070 | 10/2002 | |
| JP | 2004 75994 | 3/2004 | |
| JP | 2006 2113 | 1/2006 | |
| JP | 2006 257314 | 9/2006 | |
| JP | 2011-21128 A | 2/2011 | |
| WO | 2008 149862 | 12/2008 | |
| WO | WO 2009/113590 A1 | 9/2009 | |
| WO | WO 2009113590 * | 9/2009 | ............ C08G 69/26 |
| WO | WO 2011/030746 A1 | 3/2011 | |

OTHER PUBLICATIONS

Okada et al, Molecular Structure Determination of Polyphenylene Ether (PPE)-Polyamide (PA) Covlant Links in a PPE-PA Alloy—Application fo Two-Dimensional Nuclear Magnetic Resonance, Kobunshi BonBunsu, vol. 70, Issue 4 (2013)—Abstract, p. 1.*
Richard J. Lewis, Sr. "Hawley's Condensed Chemical Dictionary, 12th Edition", John Wiley & Sons, Inc., New York p. 1153 (1993).*
SNT Search Report, pp. 1-2, dated Oct. 24, 2017.*
Tinuvin 770—Technical Information, Nov. 2010, pp. 1-3.*
International Search Report dated Nov. 2, 2010 in PCT/JP10/05413 Filed Sep. 2, 2010.
Extended European Search Report dated May 17, 2013, in European Patent Application No. 10813513.8.

* cited by examiner

REFLECTOR FOR LED AND LIGHT-EMITTING DEVICE EQUIPPED WITH SAME

TECHNICAL FIELD

The present invention relates to a reflector for an LED, including a composition containing polyamide. The present invention also relates to a light emitting device including the reflector.

BACKGROUND ART

In recent years, new light sources, such as LEDs and organic EL devices, are in growing demand as display devices, lightings, etc. with advantages such as low power consumption and low environmental burden. Particularly, LEDs are used for various electrical and electronic device products that are, for example, mobile communication equipment such as mobile phones, displays of personal computers, liquid crystal TVs or the like, console panels of automobiles and automobile interior lightings, traffic lights, and other household appliances.

Usually, an LED is composed of a semiconductor element (LED) that emits light, a lead wire, a reflector serving also as a housing, and a transparent sealing material for sealing the semiconductor element. Among these, the reflector is formed using various materials such as ceramic and heat-resistant plastic. However, the use of ceramic for the reflector causes problems of low productivity and low initial reflectivity. On the other hand, the use of heat-resistant plastic causes a heat resistance problem in the process of thermally curing a conductive adhesive and a sealing agent at 100 to 200° C. for as long as several hours, and a problem of light reflectance decrease caused by discoloration under the environment in which the reflector is used.

In recent years, the market for white LEDs is growing rapidly in applications such as lightings and liquid crystal display panels. In the reflectors used for such white LEDs, the brightness increases as the reflectance for light at an average wavelength of about 460 nm, which corresponds to the wavelength of a blue LED, increases, and thus the reflectors are required to have a high reflectance for light at an average wavelength of about 460 nm.

So far, it has been disclosed that as a polyamide resin composition that can be molded into, for example, a reflecting mirror such as a lamp reflector, a polyamide composition obtained by adding an inorganic filler having a specific average particle diameter to polyamide composed of dicarboxylic acid units containing 60 to 100 mol % of terephthalic acid units and diamine units containing 60 to 100 mol % of aliphatic alkylene diamine units having 6 to 18 carbon atoms has excellent heat resistance during moisture absorption, and excellent dimensional stability and surface smoothness, and moreover provides molded products having a beautiful surface appearance (see Patent Literature 1).

Also, as a material for a reflector for a light emitting device such as an LED, there has been proposed a resin composition for a reflector obtained by adding a specific amount of potassium titanate fiber and/or a specific amount of wollastonite to a specific semi aromatic polyamide (see Patent Literature 2). Without spoiling useful properties of the semi aromatic polyamide, this resin composition for a reflector has high level properties in terms of light reflectance, degree of whiteness, molding processability, mechanical strength, dimensional stability, heat resistance and moisture absorbency, and particularly has an excellent light shielding property, thereby capable of keeping the degree of whiteness without causing discoloration even when being exposed to a high temperature (see Patent Literature 2).

In addition, it has been proposed that by using a polyamide resin composition obtained by adding at least one reinforcement material selected from the group consisting of titanium oxide, magnesium hydroxide, a fibrous filler and an acicular filler to semi aromatic polyamide composed of dicarboxylic acid units containing terephthalic acid units and diamine units containing 1,9-nonanediamine units and/or 2-methyl-1,8-octanediamine units, it is possible to produce a reflector for an LED that is free from discoloration, keeps high degree of whiteness and has an excellent reflectance property in a visible light range even when being subject to a high temperature heat treatment simulating the manufacturing process of the LED (see Patent Literature 3).

CITATION LIST

Patent Literature

PTL 1: JP 2000-204244 A
PTL 2: JP 2002-294070 A
PTL 3: JP 2006-257314 A

SUMMARY OF INVENTION

Technical Problem

However, the techniques described in the above-mentioned Patent Literatures 1 to 3 fail to satisfy sufficiently the increasing performance requirements for LEDs, such as higher brightness and longer life.

The present invention is intended to provide a reflector for an LED, including a polyamide composition and configured to keep high reflectance and high degree of whiteness even after being irradiated with LED light for a long period of time. The present invention is also intended to provide a light emitting device including the reflector for an LED.

Solution to Problem

In order to solve the above-mentioned problem, the present inventors have made intensive studies. As a result, the inventors have found that a composition containing polyamide (A) that has dicarboxylic acid units including dicarboxylic acid units with a specific structure and diamine units including aliphatic diamine units with a specific structure exhibits excellent heat resistance and light resistance, and have completed the present invention.

The present invention is a reflector for an LED, including a polyamide composition containing polyamide (A) that has dicarboxylic acid units including 50 to 100 mol % of 1,4-cyclohexanedicarboxylic acid units and diamine units including 50 to 100 mol % of aliphatic diamine units having 4 to 18 carbon atoms.

The present invention is also a light emitting device including the reflector for an LED.

Advantageous Effects of Invention

The reflector for an LED, including the polyamide composition, according to the present invention is capable of keeping high reflectance and high degree of whiteness even after being irradiated with LED light for a long period of time.

DESCRIPTION OF EMBODIMENTS

Figure 1:
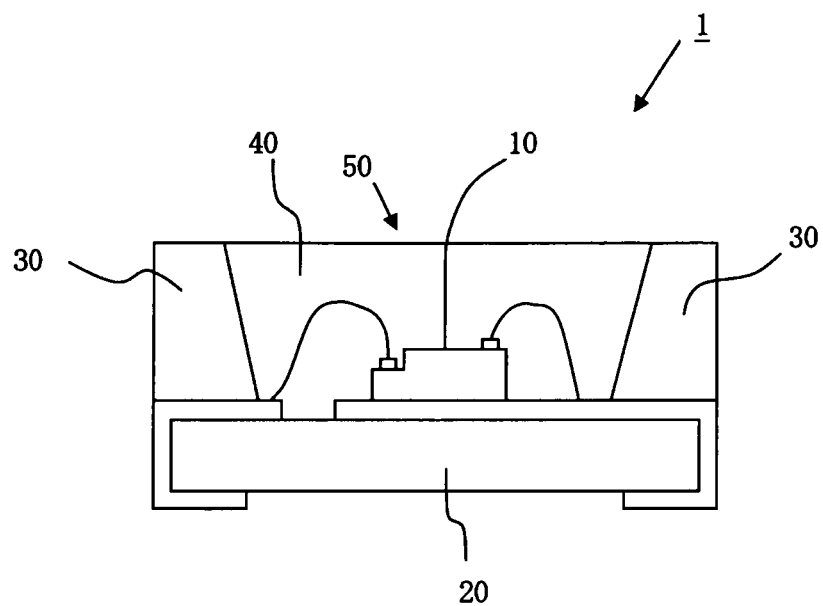
FIG. 1 is a diagram showing schematically the configuration of a light emitting device 1 according to the present invention.

The polyamide composition used for the reflector for an LED according to the present invention contains polyamide (A) that has dicarboxylic acid units including 50 to 100 mol % of 1,4-cyclohexanedicarboxylic acid units and diamine units including 50 to 100 mol % of aliphatic diamine units having 4 to 18 carbon atoms. The polyamide composition can contain further, as needed, a filler (B) such as titanium oxide, a reinforcement material (C) such as a glass fiber and wollastonite, a light stabilizer (D), and magnesium oxide (E) and/or magnesium hydroxide (E).

The dicarboxylic acid units constituting the polyamide (A) used in the present invention contains 50 to 100 mol % of, preferably 60 to 100 mol % of, more preferably 70 to 100 mol % of, and particularly preferably 90 to 100 mol % of 1,4-cyclohexanedicarboxylic acid units. When the content of the 1,4-cyclohexanedicarboxylic acid units in the dicarboxylic acid units is less than 50 mol %, the obtained polyamide composition has a decreased light resistance. The cis:trans ratio of the 1,4-cyclohexanedicarboxylic acid may be in any range.

Common heat-resistant polyamides include, in their structures, an aromatic ring structure (see Patent Literatures 1 to 3). The present inventors presume that when a heat-resistant polyamide including an aromatic ring structure is used for a reflector for an LED, the deterioration of the aromatic ring structure generates a carboxyl group serving as a chromophore, and thus the coloring of the reflector proceeds and the reflector no longer exhibits sufficient reflectance and sufficient degree of whiteness.

In the present invention, it has been found that in the case where 1,4-cyclohexanedicarboxylic acid units including no aromatic ring are used as the dicarboxylic acid units constituting the polyamide (A), the generation of a carboxyl group due to the deterioration is suppressed and excellent reflectance and excellent degree of whiteness are kept even when the polyamide (A) are used for the reflector for an LED. These effects were confirmed in the after-mentioned Examples.

The polyamide (A) can contain other dicarboxylic acid units besides 1,4-cyclohexanedicarboxylic acid units as long as the effects of the present invention are not impaired. Examples of the other dicarboxylic acid units besides 1,4-cyclohexanedicarboxylic acid units include units derived from aliphatic dicarboxylic acid such as malonic acid, succinic acid, glutaric acid, adipic acid, pimelic acid, suberic acid, azelaic acid, sebacic acid, undecanedicarboxylic acid, dodecanedicarboxylic acid, dimethylmalonic acid, 3,3-diethylsuccinic acid, 2,2-dimethylglutaric acid, 2-methyladipic acid and trimethyladipic acid; alicyclic dicarboxylic acid such as 1,3-cyclopentanedicarboxylic acid, 1,3-cyclohexanedicarboxylic acid, cycloheptanedicarboxylic acid, cyclooctanedicarboxylic acid and cyclodecanedicarboxylic acid; aromatic dicarboxylic acid such as terephthalic acid, isophthalic acid, 1,4-naphthalenedicarboxylic acid, 2,6-naphthalenedicarboxylic acid, 2,7-naphthalenedicarboxylic acid, diphenic acid, 4,4'-biphenyldicarboxylic acid, diphenylmethane-4,4'-dicarboxylic acid and diphenylsulfone-4,4'-dicarboxylic acid. One or a plurality of these units may be used. Furthermore, the polyamide (A) can contain units derived from polyvalent (trivalent or more) carboxylic acid, such as trimellitic acid, trimesic acid and pyromellitic acid as long as the above-mentioned properties of the polyamide composition are not impaired.

The diamine units constituting the polyamide (A) used in the present invention contain 50 to 100 mol % of, preferably 60 to 100 mol % of, more preferably 70 to 100 mol % of, particularly preferably 90 to 100 mol % of aliphatic diamine units having 4 to 18 carbon atoms. When the content of the aliphatic diamine units having 4 to 18 carbon atoms is 50 mol % or more, the obtained polyamide resin has excellent heat resistance and moldability.

Examples of the aliphatic diamine units having 4 to 18 carbon atoms include units derived from linear aliphatic diamine such as 1,4-butanediamine, 1,5-pentanediamine, 1,6-hexanediamine, 1,7-heptanediamine, 1,8-octanediamine, 1,9-nonanediamine, 1,10-decanediamine, 1,11-undecanediamine and 1,12-dodecanediamine; and branched aliphatic diamine such as 1-butyl-1,2-ethanediamine, 1,1-dimethyl-1,4-butanediamine, 1-ethyl-1,4-butanediamine, 1,2-dimethyl-1,4-butanediamine, 1,3-dimethyl-1,4-butanediamine, 1,4-dimethyl-1,4-butanediamine, 2,3-dimethyl-1,4-butanediamine, 2-methyl-1,5-pentanediamine, 3-methyl-1,5-pentanediamine, 2,5-dimethyl-1,6-hexanediamine, 2,4-dimethyl-1,6-hexanediamine, 3,3-dimethyl-1,6-hexanediamine, 2,2-dimethyl-1,6-hexanediamine, 2,2,4-trimethyl-1,6-hexanediamine, 2,4,4-trimethyl-1,6-hexanediamine, 2,4-diethyl-1,6-hexanediamine, 2,2-dimethyl-1,7-heptanediamine, 2,3-dimethyl-1,7-heptanediamine, 2,4-dimethyl-1,7-heptanediamine, 2,5-dimethyl-1,7-heptanediamine, 2-methyl-1,8-octanediamine, 3-methyl-1,8-octanediamine, 4-methyl-1,8-octanediamine, 1,3-dimethyl-1,8-octanediamine, 1,4-dimethyl-1,8-octanediamine, 2,4-dimethyl-1,8-octanediamine, 3,4-dimethyl-1,8-octanediamine, 4,5-dimethyl-1,8-octanediamine, 2,2-dimethyl-1,8-octanediamine, 3,3-dimethyl-1,8-octanediamine, 4,4-dimethyl-1,8-octanediamine and 5-methyl-1,9-nonanediamine. The diamine units constituting the polyamide (A) may contain one or a plurality of these.

From the viewpoint of obtaining a reflector for an LED with various excellent physical properties such as heat resistance, low water absorbency and chemical resistance, it is preferable that the above-mentioned diamine units are units derived from 1,4-butanediamine, 1,6-hexanediamine, 2-methyl-1,5-pentanediamine, 1,8-octanediamine, 2-methyl-1,8-octanediamine, 1,9-nonanediamine, 1,10-decanediamine, 1,11-undecanediamine and 1,12-dodecanediamine. More preferably, the diamine units are 1,9-nonanediamine units and/or 2-methyl-1,8-octanediamine units. Moreover, from the viewpoint of keeping the heat resistance of the obtained polyamide (A), it is preferable that linear diamine units account for 55 mol % or more of the aliphatic diamine units having 4 to 18 carbon atoms.

The above-mentioned diamine units may contain other diamine units besides the aliphatic diamine units having 4 to 18 carbon atoms as long as the effects of the present invention are not impaired. Examples of the other diamine units include units derived from aliphatic diamine such as ethylenediamine, 1,2-propanediamine and 1,3-propanediamine; alicyclic diamine such as cyclohexanediamine, methylcyclohexanediamine, isophoronediamine, norbornane dimethylamine and tricyclodecane dimethylamine; and aromatic diamine such as p-phenylenediamine, m-phenylenediamine, p-xylylenediamine, m-xylylenediamine, 4,4'-diaminodiphenylmethane, 4,4'-diaminodiphenylsulfone and 4,4'-diaminodiphenylether. The above-mentioned diamine units may contain one or a plurality of these. Preferably, the content of these other diamine units in the diamine units is 40 mol % or less, more preferably 25 mol % or less, and further preferably 10 mol % or less.

The polyamide (A) may contain aminocarboxylic acid units. Examples of the aminocarboxylic acid units include units derived from lactam such as caprolactam and lauryllactam; and aminocarboxylic acid such as 11-aminoundecanoic acid and 12-aminododecanoic acid. Preferably, the content of the aminocarboxylic acid units in the polyamide (A) is 40 mol % or less, and more preferably 20 mol % or less, with respect to 100 mol %, in total, of the dicarboxylic acid units and the diamine units in the polyamide (A).

Moreover, the polyamide (A) may contain units derived from an end-capping agent. Preferably, the content of the units derived from an end-capping agent is 3 to 10 mol %, and more preferably 3.5 to 8.5 mol %, with respect to the diamine units. When the content of the units derived from an end-capping agent with respect to the diamine units is set to fall within the above-mentioned ranges, the obtained polyamide resin has an increased light resistance, heat resistance and moldability.

In order to set the content of the units derived from an end-capping agent to fall within the desired ranges, the end-capping agent is added so as to fall within the desired ranges with respect to the diamine when preparing a raw material to be polymerized. Taking into account that a monomer component is volatilized during the polymerization, it is desirable to fine tune the amount of the end-capping agent when preparing the raw material to be polymerized so as to introduce a desired amount of the units derived from the end-capping agent into the obtained resin.

As the method for determining the amount of the units derived from an end-capping agent in the polyamide (A), there can be mentioned, for example: a method in which, as disclosed in JP 07 (1995)-228690 A, the viscosity of the solution is measured so that the total amount of terminal groups is calculated from the relationship between this viscosity and the number-average molecular weight, and the amounts of amino groups and carboxyl groups determined by titration are subtracted from the total amount of terminal groups; and a method in which the amount of the units derived from an end-capping agent is determined, by $^1$H-NMR, based on the integral values of signals corresponding respectively to the diamine units and the units derived from the end-capping agent.

As the end-capping agent, a monofunctional compound reactive with a terminal amino group or a terminal carboxyl group can be used. Specifically, examples thereof include monocarboxylic acid, acid anhydride, monoisocyanate, mono-acid halide, monoesters, monoalcohols and monoamine. From the viewpoints of reactivity and the stability of the capped end, for example, the monocarboxylic acid is preferred as the end-capping agent for a terminal amino group, whereas the monoamine is preferred as the end-capping agent for a terminal carboxyl group. Moreover, from the viewpoints of ease of handling, for example, the monocarboxylic acid is more preferred as the end-capping agent.

The monocarboxylic acid used as the end-capping agent is not limited as long as it is reactive with an amino group. Examples thereof include: aliphatic monocarboxylic acid such as acetic acid, propionic acid, butanoic acid, valeric acid, caproic acid, caprylic acid, lauric acid, tridecanoic acid, myristic acid, palmitic acid, stearic acid, pivalic acid and isobutyric acid; alicyclic monocarboxylic acid such as cyclopentane carboxylic acid and cyclohexane carboxylic acid; aromatic monocarboxylic acid such as benzoic acid, toluic acid, α-naphthalenecarboxylic acid, β-naphthalenecarboxylic acid, methylnaphthalenecarboxylic acid and phenylacetic acid; and an arbitrary mixture of these. Particularly, acetic acid, propionic acid, butanoic acid, valeric acid, caproic acid, caprylic acid, lauric acid, tridecanoic acid, myristic acid, palmitic acid, stearic acid and benzoic acid are preferred from the viewpoints of reactivity, the stability of the capped end, and price, for example.

The monoamine used as the end-capping agent is not limited as long as it is reactive with a carboxyl group. Examples thereof include aliphatic monoamine such as methylamine, ethylamine, propylamine, butylamine, hexylamine, octylamine, decylamine, stearylamine, dimethylamine, diethylamine, dipropylamine and dibutyl amine; alicyclic monoamine such as cyclohexylamine and dicyclohexylamine; aromatic monoamine such as aniline, toluidine, diphenylamine and naphthylamine; and an arbitrary mixture of these. Particularly, butylamine, hexylamine, octylamine, decylamine, stearylamine, cyclohexylamine and aniline are preferred from the viewpoints of reactivity, high boiling point, the stability of the capped end, and price, for example.

The 1,4-cyclohexanedicarboxylic acid units in the polyamide (A) of the present embodiment is present as a mixture of trans geometrical isomers and cis geometrical isomers. Since the trans-cis transition of the 1,4-cyclohexanedicarboxylic acid units in the polyamide (A) proceeds reversibly, the ratio between the trans isomers and the cis isomers is determined uniquely according to the conditions under which the polyamide (A) is produced, the conditions under which the polyamide composition is produced, and the conditions under which the reflector for an LED is produced. Since the properties, such as melting point, of the polyamide (A) of the present embodiment vary with the ratio between the trans isomers and the cis isomers in the 1,4-cyclohexanedicarboxylic acid units, the production conditions for each process are adjusted as needed to obtain a desired ratio.

The polyamide (A) used in the present invention can be produced by an arbitrary method known as a method for producing crystalline polyamide. For example, it can be produced by a method such as a solution polymerization method and an interfacial polymerization method that use acid chloride and diamine as source materials, and a melt polymerization method, a solid-phase polymerization method and a melt extrusion polymerization method that use dicarboxylic acid and diamine as source materials.

The polyamide (A) can be produced as follows, for example. First, diamine, dicarboxylic acid and, as needed, a catalyst and an end-capping agent are mixed together at one time to produce a nylon salt. Then, the mixture is thermally polymerized at a temperature of 200 to 250° C. to be a prepolymer. The prepolymer is further subject to solid-phase polymerization, or is polymerized using a melt extruder. In the case where the final step of polymerization is performed by the solid-phase polymerization, it preferably is performed under reduced pressure or under flow of an inert gas. A polymerization temperature of 200 to 280° C. provides a high polymerization rate and excellent productivity and can suppress effectively the coloring and gelling of the polyamide (A). In the case where the final step of polymerization is performed by a melt extruder, the polymerization temperature preferably is 370° C. or lower. Polymerization under such conditions causes almost no decomposition of the polyamide (A), resulting in the polyamide (A) that suffers less degradation.

Examples of the catalyst that can be used when producing the polyamide (A) include phosphoric acid, phosphorous acid and hypophosphorous acid, and salts and esters of these. Examples of the salts and esters include: salts of phosphoric acid, phosphorous acid and hypophosphorous acid with metal such as potassium, sodium, magnesium, vanadium, calcium, zinc, cobalt, manganese, tin, tungsten, germanium, titanium and antimony; ammonium salts of phosphoric acid, phosphorous acid or hypophosphorous acid; and ethyl ester, isopropyl ester, butyl ester, hexyl ester, isodecyl ester, octadecyl ester, decyl ester, stearyl ester and phenyl ester of phosphoric acid, phosphorous acid or hypophosphorous acid.

Preferably, the content of the polyamide (A) is 35 to 97 mass %, and more preferably 40 to 90 mass %, with respect to the total mass (100 mass %) of the polyamide composition used for the reflector for an LED according to the present invention. A content of the polyamide (A) less than 35 mass % may make it difficult to mold the reflector. A content of the polyamide (A) exceeding 97 mass % may cause the reflector to have insufficient reflectance and insufficient degree of whiteness.

The above-mentioned polyamide composition may contain the filler (B). Preferably, the filler (B) has a refractive index of 1.9 to 3.0. A refractive index of less than 1.9 may lower the reflectance of the obtained reflector. A refractive index of more than 3.0 may color the composition, making the composition unsuitable to be used for the reflector. In this description, the term "refractive index" refers to an absolute refractive index when a refractive index of a vacuum is taken as 1.0.

Examples of the filler (B) include zinc sulfide, strontium sulfide, barium sulfide, strontium titanate, lead titanate, barium titanate, zinc oxide, antimony oxide, titanium oxide, zirconium oxide, white lead, silver chloride and diamond. One or a plurality of these can be used. Particularly, titanium oxide is preferred from the viewpoints of safety, ease of procurement, price, ease of handling, etc. Examples of the titanium oxide include titanium oxide (TiO), titanium trioxide ($Ti_2O_3$) and titanium dioxide ($TiO_2$). Any of these may be used, but the titanium dioxide is preferred. As the titanium dioxide, titanium dioxide with a rutile-type or anatase-type crystal structure is preferred, and titanium dioxide with a rutile-type crystal structure is more preferred.

Preferably, the content of the filler (B) used in the present invention is 3 to 50 mass %, and more preferably 10 to 35 mass %, with respect to the total mass of the polyamide composition used for the reflector for an LED according to the present invention. A content of the filler (B) less than 3 mass % may cause the reflector to have insufficient reflectance and insufficient degree of whiteness. A content of the filler (B) exceeding 50 mass % may make it difficult to mold the reflector.

Too small and too large average particle diameters of the filler (B) may lower the light reflectance. Thus, the average particle diameter of the filler (B) preferably is 0.1 to 0.5 µm, more preferably 0.15 to 0.4 µm, and particularly preferably 0.2 to 0.3 µm. Here, it is possible to use a filler obtained by crushing appropriately a bulk filler or a filler with a large average particle diameter, and classifying the resultant with a sieve or the like as needed so as to achieve an average particle diameter as mentioned above.

Moreover, a surface-treated filler may be used as the filler (B). Example of the surface treatment agent include a metal oxide such as silica, alumina, zirconia, tin oxide, antimony oxide and zinc oxide; an organosilicon compound such as a silane coupling agent and silicone; an organotitanium compound such as a titanium coupling agent; and organic substances such as an organic acid and a polyol.

The polyamide composition may contain the reinforcement material (C). As the reinforcement material (C), reinforcement materials in various forms, such as fibrous, platy, acicular and cloth forms, can be used. Specifically, there can be mentioned, for example: a fibrous reinforcement material such as a glass fiber, carbon fiber, aramid fiber, liquid crystal polymer (LCP) fiber and metal fiber; a platy reinforcement material such as mica and talc; an acicular reinforcement material such as potassium titanate whisker, aluminum borate whisker, calcium carbonate whisker, magnesium sulfate whisker, wollastonite, sepiolite, xonotlite, and zinc oxide whisker; and a reinforcement material such as silica, alumina, barium carbonate, magnesium carbonate, aluminum nitride, boron nitride, potassium titanate, aluminum silicate, (kaolin, clay, pyrophyllite and bentonite), calcium silicate, magnesium silicate (attapulgite), aluminum borate, calcium sulfate, barium sulphate, magnesium sulfate, asbestos, glass bead, graphite, carbon nanotube, silicon carbide, sericite, hydrotalcite, molybdenum disulfide, phenol resin, crosslinked styrene resin and crosslinked acrylic resin. These reinforcement materials (C) may be used independently, or a plurality of these may be used in combination. The surfaces of these reinforcement materials (C) may be subject to a surface treatment using a silane coupling agent, a titanium coupling agent, a polymer compound, such as an acrylic resin, a urethane resin and an epoxy resin, or other low molecular compounds in order to enhance the dispersibility of the reinforcement materials (C) into the polyamide (A) or enhance the adhesiveness of the reinforcement materials (C) to the polyamide (A).

Among the above-mentioned reinforcement materials (C), the fibrous reinforcement material and/or the acicular reinforcement material are preferred because they are low cost materials and make it possible to obtain molded products having high dynamic strength. As the reinforcement material (C), it is preferable to use the glass fiber from the viewpoints of high strength and low cost, and it is preferable to use the acicular reinforcement material from the viewpoint of obtaining molded products having excellent surface smoothness. Particularly, from the viewpoint of keeping the degree of whiteness, it is possible to use preferably one material selected from the group consisting of a glass fiber, wollastonite, potassium titanate whisker, calcium carbonate whisker and aluminum borate whisker. More preferably, the glass fiber and/or the wollastonite are used.

In the case where the polyamide composition used for the reflector for an LED according to the present invention contains the reinforcement material (C), the content thereof preferably is 5 to 50 mass %, and more preferably 10 to 35 mass %, with respect to the total mass of the polyamide composition used for the reflector for an LED according to the present invention. A content of the reinforcement material (C) exceeding 50 mass % may lower the moldability. A content of the reinforcement material (C) less than 5 mass % may make it impossible to obtain molded products with excellent heat resistance, dimensional stability and surface smoothness.

The polyamide composition used for the reflector for an LED according to the present invention may further contain the light stabilizer (D) in order to prevent discoloration and suppress the decrease in light reflectance. Examples of the light stabilizer include a compound, such as a benzophenone compound, a salicylate compound, a benzotriazol compound, an acrylonitrile compound and other conjugated compounds, that has an effect of absorbing ultraviolet rays, and a compound, such as a hindered amine compound, that has radical trapping capability. Particularly, compounds having amide bonds in their molecule are preferred because they have high affinity with the polyamide (A) and excellent heat resistance. It is more preferable when the compound having an effect of absorbing ultraviolet rays is used in combination with the compound having radical trapping capability because a higher stabilization effect is obtained.

In the case where the polyamide composition used for the reflector for an LED according to the present invention contains the light stabilizer (D), the content thereof preferably is 2 mass % or less, and more preferably 0.05 to 2 mass %, with respect to the total mass of the polyamide composition used for the reflector for an LED according to the present invention, taking into account the effects of preventing the discoloration of the polyamide composition used for the reflector for an LED according to the present invention and suppressing the decrease in light reflectance, and from the viewpoint of preventing the production cost from increasing excessively. Two or more of these light stabilizers can be used in combination as well.

The polyamide composition used for the reflector for an LED according to the present invention may contain magnesium oxide (E) and/or magnesium hydroxide (E). Thereby, it is possible to suppress the discoloration, such as yellowing, and the decrease in the degree of whiteness even when the reflector is subject to a particularly long-time heating treatment.

The average particle diameter of the magnesium oxide (E) and/or the magnesium hydroxide (E) is not particularly limited. From the viewpoint of improving various physical properties, it preferably is 0.05 to 10 µm, and more preferably 0.1 to 5 µm. In order to enhance the adhesion to the polyamide (A) and the dispersibility, surface-treated magnesium oxide and/or surface-treated magnesium hydroxide may be used as the magnesium oxide (E) and/or the magnesium hydroxide (E). Examples of the surface treatment agent include an organosilicon compound such as a silane coupling agent like an aminosilane coupling agent and an epoxysilane coupling agent, and silicone; an organotitanium compound such as a titanium coupling agent; and an organic substance such as an organic acid and a polyol.

In the case where the polyamide composition used for the reflector for an LED according to the present invention contains the magnesium oxide (E) and/or the magnesium hydroxide (E), the content thereof preferably is 0.5 to 10 mass %, and more preferably 1 to 5 mass %, with respect to the total mass of the polyamide composition used for the reflector for an LED according to the present invention. A content of less than 0.5 mass % may decrease the effect of suppressing the discoloration after the heat treatment. A content exceeding 10 mass % may lower the moldability.

The polyamide composition used for the reflector for an LED according to the present invention may further contain another component that is, for example: a colorant such as carbon black, nigrosine, and other organic and inorganic colorants; a thermostabilizer such as phosphorous acid, phosphoric acid, phosphonous acid, and esters of these; an antioxidant such as a hindered phenol antioxidant, a thio antioxidant and a phosphorus antioxidant; an antistatic agent; a nucleating agent; a plasticizer; a wax such as a polyolefin wax and a higher fatty acid ester; a mold release agent such as silicone oil; and a lubricant. In the case where the polyamide composition used for the reflector for an LED according to the present invention contains the another component, the content thereof preferably is 5 mass % or less.

The polyamide composition used for the reflector for an LED according to the present invention can be prepared by blending the above-mentioned components in accordance with a known method. Examples of the method include a method in which the constituting components are added during the polycondensation reaction of the polyamide (A), a method in which the polyamide (A) and the other components are dry-blended, and a method in which the constituting components are melt-kneaded by an extruder. Among these, the method in which the constituting components are melt-kneaded by an extruder is preferred because it is easy to operate and provides a uniform composition. Preferably, the extruder used in this method is a twin screw type, and the melt-kneading temperature is in the range from a temperature 5° C. higher than the melting point of the polyamide (A) to a temperature of 370° C. or lower.

The reflector for an LED according to the present invention can be produced by molding the polyamide composition by a molding method, such as injection molding, extrusion molding, press molding, blow molding, calender molding and casting, that is usually used for thermoplastic resin compositions. A combined method of these molding methods can be used as well. Particularly, the injection molding is preferred from the aspects such as ease of molding, mass productivity and cost. Moreover, it also is possible to mold the polyamide composition with another polymer in combination. Furthermore, it also is possible to combine the polyamide composition with a molded metal product, fabric, etc.

Preferably, the reflector for an LED according to the present invention has a reflectance of 90% or more for light with a wavelength of 460 nm after being irradiated, at 120° C. in air for 336 hours, with metal halide lamp light having passed through a filter that allows light with a wavelength of 295 nm to 780 nm to transmit therethrough, at a position where the metal halide lamp light has an illuminance of 10 mW/cm$^2$ at a wavelength of 300 to 400 nm. By satisfying this requirement, the reflector not only can be used advantageously as a reflector for an LED but also can be applied to applications in which high reflectance and high degree of whiteness are required to be kept over a long period of time.

Preferably, the reflector for an LED according to the present invention has a load deflection temperature of 260° C. or higher under a load of 1.82 MPa. The load deflection temperature in this range can provide the reflector with sufficient solder heat resistance.

The reflector for an LED according to the present invention has high heat resistance, and keeps high reflectance and high degree of whiteness after being irradiated with LED light for a long period of time. The reflector for an LED according to the present invention can be used suitably as a reflector for LED elements used in, for example, back light sources, lightings, and various automobile lamps. Particularly, it can be used suitably as a reflector for surface-mountable LED elements.

The present invention is also a light emitting device including the above-described reflector for an LED. The light emitting device according to the present invention can be used as, for example, a back light source, a light source for lightings, and a light source for various automobile lamps.

<Light Emitting Device>

FIG. 1 shows an example of a typical configuration of the light emitting device according to the present invention. FIG. 1 illustrates schematically an SMD (surface mounted device) type light emitting device (LED device) 1. In the light emitting device 1, a light emitting element 10 is disposed in a package portion 50 formed of a substrate 20 and a reflector (housing) 30, and the package portion 50 is filled with a sealing material 40 (light transmissive resin).

Hereinafter, each component of the light emitting device according to the present invention is explained. The light emitting device according to the present invention is not limited by the following components.

<Semiconductor Light Emitting Element>

As the semiconductor light emitting element 10, a semiconductor light emitting element having a light emission peak wavelength in a wavelength range of 500 nm or less can be used suitably. The semiconductor light emitting element 10 is not limited to a semiconductor light emitting element with a single light emission peak, and a semiconductor light emitting element with a plurality of light emission peaks also can be used. In the case of having a plurality of light emission peaks, the semiconductor light emitting element may have one or a plurality of light emission peaks in a range of wavelength longer than 500 nm. Moreover, it also is possible to use a semiconductor light emitting element having a light emission peak in a long-wavelength range (501 nm to 780 nm) of visible light.

The configuration of the semiconductor light emitting element 10 is not particularly limited as long as it has the above-mentioned wavelength property. For example, it is possible to use a semiconductor light emitting element with a light emitting layer formed of a semiconductor such as GaAlN, ZnS, ZnSe, SiC, GaP, GaAlAs, AlN, InN, AlInGaP, InGaN, GaN and AlInGaN.

The light emitting layer may contain an arbitrary dopant.

A plurality of the semiconductor light emitting elements 10 can be used appropriately. For example, it is possible to use two light emitting elements capable of emitting green light, one light emitting element capable of emitting blue light, and one light emitting element capable of emitting red light.

The method for connecting the semiconductor light emitting element 10 to the substrate 20 is not particularly limited, and conductive epoxy and silicone adhesives can be used. In addition, a metal with a low melting point can be used in order to transfer effectively the heat generated from the semiconductor element to the substrate. Examples of the metal include Sn/Ag/Cu (with a melting point of 220° C.) and Sn/Au (with a melting point of 282° C.).

<Package>

The package is a member in which the semiconductor light emitting element 10 is mounted. The package, partly or entirely, is formed of the reflector for an LED according to the present invention.

In the present invention, the package may be composed of a single member or a plurality of members in combination.

Preferably, the package has a recessed portion (cup-shaped portion). As an example of the package, a package composed of a reflector (housing) and a substrate in combination can be mentioned. In FIG. 1, for example, the package has a configuration in which the reflector (housing) 30 with a desired shape is boned to the substrate 20 so as to form the recessed portion (cup-shaped portion) 50. The substrate 20 and the reflector 30 each are formed of the reflector for an LED according to the present invention obtained by molding the polyamide composition. Only one of the substrate 20 and the reflector 30 may be formed of the reflector for an LED according to the present invention. When a plurality of the reflectors for an LED according to the present invention are used as mentioned above, the reflectors for an LED with different properties obtained by molding the polyamide compositions having different compositions may be used in combination. As another example, there can be mentioned a configuration in which the polyamide composition is molded so as to form the recessed portion (cup-shaped portion) on one side so that the package is composed of a single reflector for an LED. As still another example, there can be mentioned a configuration in which the package is composed only of a platy reflector for an LED.

The recessed portion (cup-shaped portion) formed in the package refers to a portion that has a bottom part and a side part and is formed of a space with a shape that allows the area of a cross-section perpendicular to an optical axis to increase continuously or gradually from the bottom part toward the light emitting direction of the light emitting device. The shapes of the bottom part and the side part are not particularly limited as long as these conditions are satisfied.

<Sealing Material>

The sealing material 40 is formed so as to cover the light emitting element 10. The sealing material 40 is provided mainly to protect the light emitting element 10 from outside environment.

As the sealing material 40, a transparent thermosetting resin can be used to protect the semiconductor element 10 and wiring. Examples of the transparent thermosetting resin include a thermosetting resin containing epoxy or silicone. As the silicone, resin type, rubber type and gel type silicones can be used in accordance with the characteristics required for the package. In order to increase the adhesion between the reflector 30 and the sealing resin, it is possible to treat the reflector 30 with plasma of rare gas such as argon.

The sealing material can also be provided so that a plurality of layers made of different materials are laminated on the light emitting element.

The sealing material 40 may contain a phosphor. The use of a phosphor makes it possible to convert a part of light emitted from the light emitting element into light with a different wavelength, and to change or correct the color of light emitted from the light emitting device.

As the phosphor, any phosphor can be used as long as it can be excited by the light emitted from the light emitting element. For example, at least one selected from the following is used preferably. A nitride phosphor, an oxynitride phosphor and a sialon phosphor that are activated mainly by a lanthanoid element such as Eu and Ce; an alkaline earth metal aluminate phosphor, alkaline earth silicate, alkaline earth sulfide, alkaline earth thio gallate, alkaline earth silicon nitride and germinate that are activated mainly by a lanthanoid element such as Eu and a transition metal element such as Mn; rare earth aluminate and rare earth silicate that are activated mainly by a lanthanoid element such as Ce; and an organic compound and an organic complex that are activated mainly by a lanthanoid element such as Eu.

Moreover, the sealing material can contain a plurality of phosphors in combination. In this case, it also is possible to use, in combination, a phosphor that emits light by being excited by the light from the light emitting element and a phosphor that emits light by being excited by the light from the phosphor.

It also is possible for the sealing material 40 to contain a light diffuser, such as titanium dioxide and zinc oxide, so as to accelerate the diffusion of light inside the sealing material and reduce the unevenness in light emission.

The light emitting device 1 in FIG. 1 is produced as follows, for example. First, the reflector 30, which is the reflector for an LED according to the present invention, is disposed on the substrate 20, which is the reflector for an LED according to the present invention. Next, the light emitting element 10 is mounted, and electrodes of the light emitting element 10 are connected to a wiring pattern on the substrate 20 with leads. Subsequently, a liquid silicone sealing material composed of a base and a curing agent is prepared and potted into the cup-shaped portion 50. The silicone sealing material is heated in this state at about 150° C. to be thermally cured. Thereafter, the silicone sealing agent radiates heat into the air.

Figure 2:
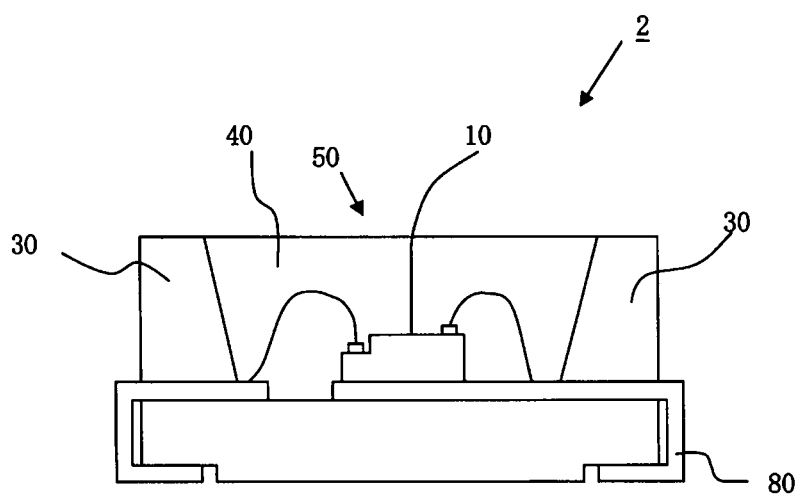
FIG. 2 is a diagram showing schematically the configuration of a light emitting device 2 according to the present invention.

FIG. 2 shows a schematic view of a light emitting device 2 according to the present invention, having a different configuration. In FIG. 2, the same components as those in the light emitting device 1 are indicated with the same reference numerals. In the light emitting device 2, a lead frame 80 is used instead of the substrate, and the light emitting element 10 is mounted on the lead frame 80. The configuration is the same as that of the light emitting device 1 except for these.

Figure 3:
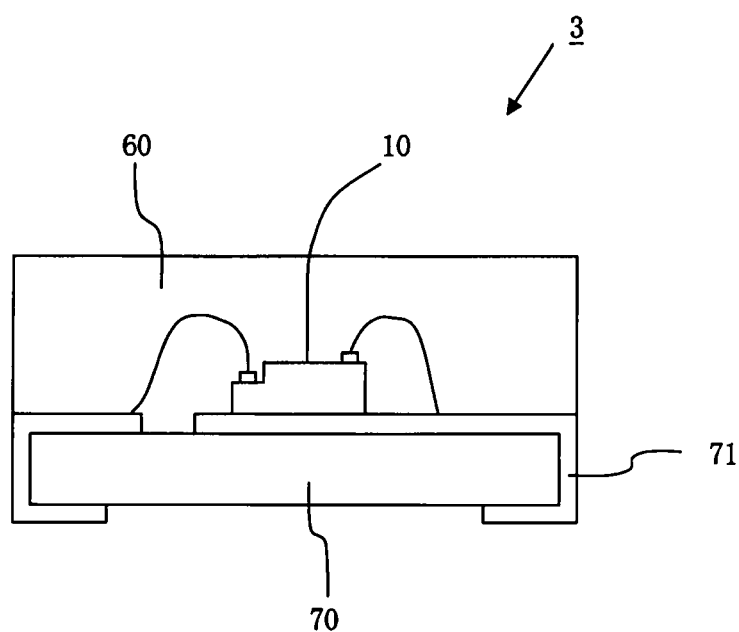
FIG. 3 is a diagram showing schematically the configuration of a light emitting device 3 according to the present invention.

FIG. 3 shows a schematic view of a light emitting device 3 according to the present invention, having another different configuration. In FIG. 3, the same components as those in the light emitting device 1 are indicated with the same reference numerals. In the light emitting device 3, a substrate 70 that is the reflector for an LED according to the present invention is used. The substrate 70 is provided with a desired wiring 71. No housing (reflector) is used, and as is illustrated, a sealing material 60 can be formed by molding with a desired mold after the light emitting element 10 is mounted. Alternatively, it also is possible to prepare in advance the sealing material 60 molded into a desired shape and bond it to the substrate 70 so as to cover the light emitting element 10.

Although the SMD type light emitting devices are described above as configuration examples of the present invention, the present invention can also be applied to a so-called lamp type light emitting diode in which a light emitting element is mounted on a lead frame having a cup-shaped portion, and the light emitting element and a part of the lead frame are covered with a sealing material. Moreover, the present invention can also be applied to a flip-chip light emitting device in which a light emitting element is mounted, in the form of so-called flip chip, on a substrate or a lead frame.

EXAMPLES

Hereinafter, the present invention is described in more detail with reference to Examples and Comparative Examples. The present invention is not limited to these Examples.

In the following Examples and Comparative Examples, the end-capping agent units, solution viscosity, melting point, ratio of trans isomers, reflectance, degree of whiteness and load deflection temperature were evaluated as follows.

<End-capping Agent Units>

A part of each of the samples, Polyamide 1 to Polyamide 8, obtained in the after-mentioned Reference Examples 1 to 8 was taken, and the molar ratios of the diamine units and the units derived from the end-capping agent were calculated from the integral values of characteristic signals corresponding respectively to these units by using $^1$H-NMR (measured at 500 MHz, in deuterated trifluoroacetic acid, at room temperature) to determine the percentage (mol %) of the units derived from the end-capping agent to the diamine units. The chemical shift values of typical signals are shown below.

TABLE 1

| Constituting units of polyamide | Protons to be integrated in the constituting units | Chemical shift value of characteristic signal |
| --- | --- | --- |
| Diamine units | Protons of methylene group in —CH$_2$—NHCO— | δ 3.2 to 3.8 ppm |
| Benzoic acid units | Protons in meta position with respect to amide group in Ph—CONH— | δ 7.4 to 7.5 ppm |

<Solution Viscosity $\eta_{inh}$>

A part of each of the samples, Polyamide 1 to Polyamide 8, obtained in the after-mentioned Reference Examples 1 to 8 was taken, and 50 mg thereof was dissolved in 25 ml of concentrated sulfuric acid in a measuring flask. This test liquid was measured for flow time (t) at 30° C. using an Ubbelohde viscometer so as to calculate the solution viscosity using the flow time ($t_0$) of the concentrated sulfuric acid by the formula (1) below.

$$\eta_{inh} \text{ (dl/g)} = \{\ln(t \div t_0)\} \div 0.2 \text{ (g/dl)} \tag{1}$$

<Melting Point>

A part of each of the samples, Polyamide 1 to Polyamide 8, obtained in the after-mentioned Reference Examples 1 to 8 was taken, and about 10 mg thereof was heated from 30° C. to 360° C. at a rate of 10° C./minute in a nitrogen atmosphere using a differential scan calorimetric analyzer (DSC822) manufactured by METTLER-TOLEDO Inc., and the sample was maintained at 360° C. for 2 minutes to be melted completely. Then, the sample was cooled to 30° C. at a rate of 10° C./minute and maintained at 30° C. for 2 minutes. The peak temperature of the melting peak that appeared when the sample was heated again to 360° C. at the rate of 10° C./minute was defined as the melting point. In the case where a plurality of melting peaks were observed, the peak temperature of the melting peak on the highest temperature side was used as the melting point.

<Ratio of Trans Isomers>

The polyamide composition obtained in each of the Examples and Comparative Examples was injection-molded (with the temperature of the mold being 140° C.) at a cylinder temperature that was about 20° C. higher than the melting point of polyamide to produce a specimen with a thickness of 1 mm, a width of 40 mm and a length of 100 mm. An amount of 20 to 30 mg was cut out from this specimen and dissolved in 1 ml of deuterated trifluoroacetic acid, and the solution was subject to a $^1$H-NMR measurement using a nuclear magnetic resonance apparatus JNM-ECX400 manufactured by JEOL Ltd. under the conditions of room temperature and the number of integrations of 256. The ratio of trans isomers was calculated from the ratio of the peak area at 3.47 ppm due to a cis isomer of 1,4-cyclohexanedicarboxylic acid and the ratio of the peak area at 3.50 ppm due to a trans isomer of 1,4-cyclohexanedicarboxylic acid.

<Reflectance>

The polyamide composition obtained in each of the Examples and Comparative Examples was injection-molded (with the temperature of the mold being 140° C.) at a cylinder temperature that was about 20° C. higher than the melting point of polyamide to produce a specimen with a thickness of 1 mm, a width of 40 mm and a length of 100 mm. This specimen was placed at a distance of 25 cm from an upper quartz glass surface of a light resistance testing apparatus (Super Win Mini, manufactured by DAIPLA WINTES Co., Ltd.) having a KF-1 filter (manufactured by DAIPLA WINTES Co., Ltd.) that allows light with a wavelength of 295 nm to 780 nm to transmit therethrough, and the specimen was irradiated with the light for 336 hours with the temperature in a vessel being set at 120° C. The light had an illuminance of 10 mW/cm$^2$ at a wavelength of 300 to 400 nm at the position where the specimen was placed. The specimen that had been irradiated with the light was measured for reflectance at a wavelength of 460 nm by a spectrophotometer (U-4000) manufactured by HITACHI, Ltd.

<Degree of Whiteness>

The specimen on which the reflectance measurement had been made was measured for color by spectrocolorimeter SD5000 (manufactured by NIPPON DENSHOKU INDUSTRIES Co., Ltd.), and lightness (L), red value (a) and yellow value (b) were determined by Hunter's color difference formula. The degree of whiteness was calculated by the formula (2) below.

$$W=100-[(100-L)^2+a^2+b^2]^{1/2} \quad (2)$$

a: Red value
b: Yellow value
L: Lightness

<Load Deflection Temperature>

The polyamide composition obtained in each of the Examples and Comparative Examples was injection-molded (with the temperature of the mold being 140° C.) at a temperature about 20° C. higher than the melting point of polyamide to produce a specimen (dumbbell-shaped, in accordance with JIS K7207). This specimen was measured for heat deflection temperature under a load of 1.82 MPa using a load deflection temperature measuring apparatus (S-3M, manufactured by TOYO SEIKI SEISAKU-SHO). The result was defined as the load deflection temperature.

The following materials were used in the Examples and Comparative Examples below.

Reference Example 1

Polyamide 1

5111.2 g (29.7 mol) of 1,4-cyclohexanedicarboxylic acid in which the cis:trans ratio was 70:30, 4117.6 g (26.0 mol) of 1,9-nonanediamine, 726.6 g (4.59 mol) of 2-methyl-1,8-octanediamine, 224.2 g (1.84 mol) of benzoic acid as the end-capping agent, 10 g of sodium hypophosphite monohydrate, and 2.5 L of distilled water were put into an autoclave with an internal volume of 40 L, and the atmosphere thereof was replaced by nitrogen. The internal temperature of the autoclave was raised to 200° C. over 2 hours. At this time, the pressure in the autoclave was increased to 2 MPa. Thereafter, the internal temperature was maintained at 215° C. for 2 hours, and the mixture was reacted while water vapor was extracted gradually and the pressure was maintained at 2 MPa. Subsequently, the pressure was lowered to 1.2 MPa over 30 minutes to obtain a prepolymer. The prepolymer was crushed into the size of 2 mm or less, and dried at 120° C. under reduced pressure for 12 hours. The resultant was subjected to solid-phase polymerization under the conditions of 230° C. and 13.3 Pa for 10 hours. Thus, Polyamide 1 containing 4.3 mol % of the end-capping agent units and having a solution viscosity $\eta_{inh}$ of 0.87 dl/g and a melting point of 315° C. was obtained.

Reference Example 2

Polyamide 2

The polymerization was performed by the method described in Reference Example 1, except that 5111.2 g (29.7 mol) of 1,4-cyclohexanedicarboxylic acid in which the cis:trans ratio was 0:100 was used instead of 5111.2 g (29.7 mol) of 1,4-cyclohexanedicarboxylic acid in which the cis:trans ratio was 70:30. Thus, Polyamide 2 containing 4.5 mol % of the end-capping agent units and having a solution viscosity $\eta_{inh}$ of 0.85 dl/g and a melting point of 315° C. was obtained.

Reference Example 3

Polyamide 3

4813.3 g (28.0 mol) of 1,4-cyclohexanedicarboxylic acid in which the cis:trans ratio was 70:30, 4965.6 g (28.8 mol) of 1,10-decanediamine, 211.2 g (1.73 mol) of benzoic acid, 10 g of sodium hypophosphite monohydrate, and 2.5 L of distilled water were put into an autoclave with an internal volume of 40 L, and then the mixture was polymerized by the method described in Reference Example 1. Thus, Polyamide 3 containing 4.5 mol % of the end-capping agent units and having a solution viscosity $\eta_{inh}$ of 1.0 dl/g and a melting point of 328° C. was obtained.

Reference Example 4

Polyamide 4

4652.2 g (27.0 mol) of 1,4-cyclohexanedicarboxylic acid in which the cis:trans ratio was 70:30, 5133.7 g (27.9 mol) of 1,11-undecanediamine, 204.1 g (1.67 mol) of benzoic acid, 10 g of sodium hypophosphite monohydrate, and 2.5 L of distilled water were put into an autoclave with an internal volume of 40 L, and then the mixture was polymerized by the method described in Reference Example 1. Thus, Polyamide 4 containing 4.6 mol % of the end-capping agent units and having a solution viscosity $\eta_{inh}$ of 1.0 dl/g and a melting point of 304° C. was obtained.

Reference Example 5

Polyamide 5

4056.3 g (23.6 mol) of 1,4-cyclohexanedicarboxylic acid in which the cis:trans ratio was 70:30, 978.4 g (5.89 mol) of terephthalic acid, 4063.7 g (25.7 mol) of 1,9-nonanediamine, 717.1 g (4.53 mol) of 2-methyl-1,8-octanediamine, 184.4 g (1.51 mol) of benzoic acid as the end-capping agent, 10 g of sodium hypophosphite monohydrate, and 2.5 L of distilled water were put into an autoclave with an internal volume of 40 L, and the atmosphere thereof was replaced by nitrogen. The internal temperature of the autoclave was raised to 200° C. over 2 hours. At this time, the pressure in the autoclave was increased to 2 MPa. Thereafter, the internal temperature was maintained at 215° C. for 2 hours, and the mixture was reacted while water vapor was extracted gradually and the pressure was maintained at 2 MPa. Subsequently, the pressure was lowered to 1.2 MPa over 30 minutes to obtain a prepolymer. The prepolymer was crushed into the size of 2 mm or less, and dried at 120° C. under reduced pressure for 12 hours. The resultant was subjected to solid-phase polymerization under the conditions of 230° C. and 13.3 Pa for 10 hours. Thus, Polyamide 5 containing 4.0 mol % of the end-capping agent units and having a solution viscosity $\eta_{inh}$ of 1.06 dl/g and a melting point of 302° C. was obtained.

Reference Example 6

Polyamide 6

4926.1 g (29.7 mol) of terephthalic acid, 4113.9 g (26.0 mol) of 1,9-nonanediamine, 726.0 g (4.59 mol) of 2-methyl-1,8-octanediamine, 224.0 g (1.83 mol) of benzoic acid, 10 g of sodium hypophosphite monohydrate, and 2.5 L of distilled water were put into an autoclave with an internal volume of 40 L, and then the mixture was polymerized by the method described in Reference Example 1. Thus, Polyamide 6 containing 5.9 mol % of the end-capping agent units and having a solution viscosity $\eta_{inh}$ of 0.80 dl/g and a melting point of 306° C. was obtained.

Reference Example 7

Polyamide 7

2358.1 g (14.2 mol) of terephthalic acid, 3112.1 g (21.3 mol) of adipic acid, 4251.7 g (36.6 mol) of hexamethylenediamine, 268.1 g (2.2 mol) of benzoic acid, 10 g of sodium hypophosphite monohydrate, and 2.5 L of distilled water were put into an autoclave with an internal volume of 40 L, and then the mixture was polymerized by the method described in Reference Example 1. Thus, Polyamide 7 containing 5.7 mol % of the end-capping agent units and having a solution viscosity $\eta_{inh}$ of 0.85 dl/g and a melting point of 290° C. was obtained.

Reference Example 8

Polyamide 8

2423.5 g (14.1 mol) of 1,4-cyclohexanedicarboxylic acid in which the cis:trans ratio was 70:30, 3085.4 g (21.1 mol) of adipic acid, 4215.3 g (36.3 mol) of hexamethylenediamine, 265.8 g (2.2 mol) of benzoic acid, 10 g of sodium hypophosphite monohydrate, and 2.5 L of distilled water were put into an autoclave with an internal volume of 40 L, and then the mixture was polymerized by the method described in Reference Example 1. Thus, Polyamide 8 containing 4.5 mol % of the end-capping agent units and having a solution viscosity $\eta_{inh}$ of 0.88 dl/g and a melting point of 290° C. was obtained.

[Filler (B)]

"TIPAQUE CR-90" (titanium dioxide with an average particle diameter of 0.25 μm and a refractive index of 2.71) produced by ISHIHARA SANGYO KAISHA, Ltd.

[Reinforcement Material (C)]

"CS3J256" (glass fiber: GF) produced by NITTO BOSEKI Co., Ltd.

"SH-1250" (wollastonite: WS) produced by KINSEI MATEC, Co., Ltd.

[Light stabilizer (D)]

"Nylostab S-EED" (2-ethyl-2-ethoxy-oxalanilide) produced by CLARIANT JAPAN

[Magnesium oxide (E)]

"MF-150" (magnesium oxide with an average particle diameter of 0.71 μm) produced by KYOWA CHEMICAL INDUSTRY Co., Ltd.

Examples 1 to 8 and Comparative Examples 1 to 4

The polyamides shown in Tables 2 and 3 each were dried at 120° C. under reduced pressure for 24 hours, and then dry-blended with the titanium oxide, the light stabilizer, the magnesium oxide and the mold release agent in the amounts shown in Table 2 and 3. The obtained mixtures each were fed from a hopper of a twin screw extruder (with a screw diameter of 32 mm, L/D=30, and a rotation speed of 150 rpm). At the same time, the reinforcement material in each amount shown in Table 2 and 3 was added thereto from a side feeder so as to be melt-kneaded, and the resultant was extruded into a strand shape, and then cut by a pelletizer. Thus, polyamide compositions in a pellet form were obtained. Specimens with a specified shape were produced from the obtained polyamide compositions, respectively, in accordance with the above mentioned method, and the specimens were evaluated for various physical properties. Table 2 and 3 show the results.

TABLE 2

| | | | Example 1 | Example 2 | Example 3 | Example 4 | Example 5 | Example 6 | Example 7 | Example 8 |
|---|---|---|---|---|---|---|---|---|---|---|
| Structure of polyamide (A) | Polyamide (A) | | Polyamide 1 | Polyamide 1 | Polyamide 1 | Polyamide 1 | Polyamide 2 | Polyamide 3 | Polyamide 4 | Polyamide 5 |
| | Diamine | Mol % | C9DA/MC8DA (85/15) | C9DA/MC8DA (85/15) | C9DA/MC8DA (85/15) | C9DA/MC8DA (85/15) | C9DA/MC8DA (85/15) | C10DA (100) | C11DA (100) | C9DA/MC8DA (85/15) |
| | Dicarboxylic acid | Mol % | CHDA (100) | CHDA (100) | CHDA (100) | CHDA (100) | CHDA (100) | CHDA (100) | CHDA (100) | CHDA/TA (80/20) |
| | Cis:trans ratio of CHDA | | 70:30 | 70:30 | 70:30 | 70:30 | 0:100 | 70:30 | 70:30 | 70:30 |
| | Amount of units derived from end-capping agent | Mol % | 4.3 | 4.3 | 4.3 | 4.3 | 4.5 | 4.5 | 4.6 | 4.0 |
| Composition of polyamide composition | Polyamide (A) | Mass % | 72.6 | 52.6 | 62.6 | 57.6 | 57.6 | 57.6 | 57.6 | 57.6 |
| | Titanium oxide (B) | Mass % | 9.9 | 29.9 | 19.9 | 19.9 | 19.9 | 19.9 | 19.9 | 19.9 |
| | Reinforcement material (C) | Mass % | 15.0 (GF) | 15.0 (GF) | 15.0 (GF) | 20.0 (WS) | 20.0 (WS) | 20.0 (WS) | 20.0 (WS) | 20.0 (WS) |

TABLE 2-continued

|  |  |  | Example 1 | Example 2 | Example 3 | Example 4 | Example 5 | Example 6 | Example 7 | Example 8 |
|---|---|---|---|---|---|---|---|---|---|---|
|  | Light stabilizer (D) | Mass % | 0.3 | 0.3 | 0.3 | 0.3 | 0.3 | 0.3 | 0.3 | 0.3 |
|  | Magnesium oxide (E) | Mass % | 1.9 | 1.9 | 1.9 | 1.9 | 1.9 | 1.9 | 1.9 | 1.9 |
|  | Mold release agent | Mass % | 0.3 | 0.3 | 0.3 | 0.3 | 0.3 | 0.3 | 0.3 | 0.3 |
| Evaluation results of polyamide composition | Ratio of trans isomers in polyamide | % | 76 | 76 | 76 | 76 | 78 | 75 | 75 | 77 |
|  | Reflectance (after 336 hours) | % | 90 | 94 | 92 | 93 | 93 | 92 | 93 | 91 |
|  | Degree of whiteness | 0 hours | 96 | 97 | 96 | 96 | 96 | 96 | 96 | 96 |
|  |  | After 336 hours | 94 | 96 | 95 | 96 | 96 | 96 | 96 | 94 |
|  | Load deflection temperature | ° C. | 287 | 288 | 288 | 274 | 274 | 277 | 244 | 261 |

GF: Glass fiber
WS: Wollastonite
CHDA: 1,4-cyclohexanedicarboxylic acid
C9DA: 1,9-nonane diamine
MC8DA: 2-methyl-1,8-octane diamine
C10DA: 1,10-decanediamine
CHDA: 1,11-undecanediamine

TABLE 3

|  |  |  | C. Example 1 | C. Example 2 | C. Example 3 | C. Example 4 |
|---|---|---|---|---|---|---|
| Structure of polyamide (A) | Polyamide (A) |  | Polyamide 6 | Polyamide 6 | Polyamide 7 | Polyamide 8 |
|  | Diamine | Mol % | C9DA/MC8DA (85/15) | C9DA/MC8DA (85/15) | C6DA (100) | C6DA (100) |
|  | Dicarboxylic acid | Mol % | TA (100) | TA (100) | TA/AdA (40/60) | CHDA/AdA (40/60) |
|  | Cis:trans ratio of CHDA |  | — | — | — | 70:30 |
|  | Amount of units derived from end-capping agent | Mol % | 5.9 | 5.9 | 5.7 | 4.5 |
| Composition of polyamide composition | Polyamide (A) | Mass % | 62.6 | 57.6 | 57.6 | 57.6 |
|  | Titanium oxide (B) | Mass % | 19.9 | 19.9 | 19.9 | 19.9 |
|  | Reinforcement material (C) | Mass % | 15.0(GF) | 20.0(WS) | 20.0(WS) | 20.0(WS) |
|  | Light stabilizer (D) | Mass % | 0.3 | 0.3 | 0.3 | 0.3 |
|  | Magnesium oxide (E) | Mass % | 1.9 | 1.9 | 1.9 | 1.9 |
|  | Mold release agent | Mass % | 0.3 | 0.3 | 0.3 | 0.3 |
| Evaluation results of polyamide composition | Ratio of trans isomers in polyamide | % | — | — | — | 78 |
|  | Reflectance (after 336 hours) | % | 84 | 86 | 78 | 90 |
|  | Degree of whiteness | 0 hours | 96 | 96 | 95 | 93 |
|  |  | After 336 hours | 88 | 92 | 80 | 90 |
|  | Load deflection temperature | ° C. | 275 | 260 | 240 | 252 |

GF: Glass fiber
WS: Wollastonite
CHDA: 1,4-cyclohexanedicarboxylic acid
AdA: Adipic acid
TA: Terephthalic acid
C6DA: 1,6-hexanediamine
C9DA: 1,9-nonanediamine
MC8DA: 2-methyl-1,8-octanediamine Examples 9 and 10 and Comparative Examples 5 to 7

The light emitting devices of Examples 9 and 10 and Comparative Examples 5 to 7 were produced as follows using the reflectors for an LED produced respectively from the polyamide compositions of Examples 4 and 7 and Comparative Examples 2 to 4.

Example 9

The light emitting device had the configuration of the SMD type light emitting device 1 shown in FIG. 1. As the light emitting element 10, a light emitting element that had a light emission peak wavelength of 460 nm and emitted blue light was used. As the sealing material 40, silicone (product name KER2500 produced by SHIN-ETSU CHEMICALS Co., Ltd.) was used. As the reflector 30, an inhouse-made reflector in the size of 3228 was used.

The polyamide composition of Example 4 was used for the reflector 30 in Example 9. The sealing material contained a YAG phosphor represented as (Y,Ga)$_3$Al$_5$O$_{12}$:Ce.

Example 10

In Example 10, the material of the reflector 30 was changed to the polyamide composition of Example 7, and the SMD type light emitting device shown in FIG. 1 was produced as in Example 9.

Comparative Example 5

In Comparative Example 5, the material of the reflector 30 was changed to the polyamide composition of Comparative Example 2, and the SMD type light emitting device shown in FIG. 1 was produced as in Example 9.

Comparative Example 6

In Comparative Example 6, the material of the reflector 30 was changed to the polyamide composition of Comparative Example 3, and the SMD type light emitting device shown in FIG. 1 was produced as in Example 9.

Comparative Example 7

In Comparative Example 7, the material of the reflector 30 was changed to the polyamide composition of Comparative Example 4, and the SMD type light emitting device shown in FIG. 1 was produced as in Example 9.

The light emitting devices produced in Examples 9 and 10 and Comparative Examples 5 to 7 were evaluated for luminous intensity retention rate by the following method. Table 4 shows the evaluation results.

<Method for Measuring Luminous Intensity Retention Rate>

The light emitting devices of Examples 9 and 10 and Comparative Examples 5 to 7 were subject to a power-on test at 85° C. and 15 mA for 1000 hours, and the luminous intensity after 1000 hours with respect to the luminous intensity at 0 hours was determined to measure the luminous intensity retention rate (the luminous intensity after 1000 hours/the luminous intensity at 0 hours). For each of these Examples and Comparative Examples, 150 light emitting devices were measured for the luminous intensity, and the average value thereof was defined as the luminous intensity of each Example and the Comparative Example.

TABLE 4

|  | Light emitting device | | | | |
| --- | --- | --- | --- | --- | --- |
|  | Example 9 | Example 10 | C. Example 5 | C. Example 6 | C. Example 7 |
| Polyamide composition | Example 4 | Example 7 | C. Example 2 | C. Example 3 | C. Example 4 |
| Luminous intensity retention rate (%) | 98 | 98 | 90 | 83 | 94 |

As is apparent from Table 4, it was confirmed that the light emitting devices (Examples 9 and 10) including the reflectors for an LED produced respectively from the polyamide compositions of Examples 4 and 7 had high luminous intensity retention rates.

INDUSTRIAL APPLICABILITY

The reflector for an LED according to the present invention is almost free from discoloration, and has heat resistance and light resistance for keeping high reflectance even under severe conditions of being irradiated with UV-included light at 120° C. in air for 336 hours. Also, the reflector for an LED according to the present invention has a very high heat deflection temperature that is 260° C. or higher. Particularly, the reflector for an LED according to the present invention can be used suitably as a reflector for surface-mountable LEDs. LED light sources are featured with greater power saving and lower environmental burden than those of conventional fluorescent lamps. Accordingly, the present invention is a technique that contributes to the development of these LED light sources, and has a significant industrial advantage.

The invention claimed is:

1. A reflector for an LED, consisting of a polyamide composition consisting of a polyamide (A), a filler (B) and optionally at least one additional component selected from the group consisting of reinforcement material (C), a light stabilizer (D), magnesium oxide (E), magnesium hydroxide (E), and an additive (F)
    wherein the polyamide (A) has dicarboxylic acid units including 90 to 100 mol. % of 1,4-cyclohexanedicarboxylic acid units and diamine units including 50 to 100 mol. % of aliphatic diamine units having 4 to 18 carbon atoms,
    the polyamide (A) has 3 to 10 mol. % of units derived from an end-capping agent with respect to the aliphatic diamine units having 4 to 18 carbon atoms,
    the filler (B) is at least one selected from the group consisting of zinc sulfide, strontium sulfide, barium sulfide, strontium titanate, lead titanate, barium titanate, zinc oxide, antimony oxide, titanium oxide, zirconium oxide, white lead, silver chloride and diamond,
    the reinforcement material (C) is a fibrous reinforcement material and/or an acicular reinforcement material,
    the additive (F) is at least one selected from the group consisting of a colorant, a thermostabilizer, an antioxidant, an antistatic agent, a nucleating agent, a plasticizer, a wax, a mold release agent and a lubricant, and
    a content of the additive (F) is 5 mass % or less with respect to a total mass of the polyamide composition,
    the filler (B) is present in the polyamide composition in the amount of 3 to 50 mass % with respect to a total mass of the polyamide composition.

2. The reflector for an LED according to claim 1, wherein the filler (B) is titanium oxide.

3. The reflector for an LED according to claim 1, wherein linear diamine units account for 55 mol. % or more of the aliphatic diamine units having 4 to 18 carbon atoms.

4. The reflector for an LED according to claim 1, wherein the aliphatic diamine units having 4 to 18 carbon atoms are 1,9-nonanediamine units and/or 2-methyl-1,8-octanediamine units.

5. The reflector for an LED according to claim 1, wherein the reinforcement material (C) is present in the polyamide composition.

6. The reflector for an LED according to claim 5, wherein the reinforcement material (C) is a glass fiber and/or wollastonite.

7. The reflector for an LED according to claim 1, wherein the light stabilizer (D) is present in the polyamide composition.

8. The reflector for an LED according to claim 1, wherein the magnesium oxide (E) and/or the magnesium hydroxide (E) is present in the polyamide composition.

9. The reflector for an LED according to claim 1, wherein the reflector has a reflectance of 90% or more for light with a wavelength of 460 nm after being irradiated, at 120° C. in air for 336 hours, with metal halide lamp light having passed through a KF-1 filter, at a position where the metal halide lamp light has an illuminance of 10 mW/cm$^2$ at a wavelength of 300 to 400 nm.

10. The reflector for an LED according to claim 1, wherein a load deflection temperature under a load of 1.82 MPa is 260° C. or higher.

11. A light emitting device comprising the reflector for an LED according to claim 1.

12. The reflector for an LED according to claim 1, wherein the end-capping agent is at least one compound selected from the group consisting of a monocarboxylic acid, an acid anhydride, a monoisocyanate, a mono-acid halide, a monoester, a monoalcohol and a monoamine.

13. The reflector for an LED according to claim 1, wherein the reinforcement material (C), the light stabilizer (D), and the magnesium oxide (E) and/or the magnesium hydroxide (E) are present in the polyamide composition.

14. The reflector for an LED according to claim 13, wherein the end-capping agent is a monocarboxylic acid.

* * * * *